(12) United States Patent
Kim et al.

(10) Patent No.: US 12,353,847 B2
(45) Date of Patent: Jul. 8, 2025

(54) SEMICONDUCTOR DEVICE CAPABLE OF PERFORMING IN-MEMORY PROCESSING

(71) Applicants: SK hynix Inc., Icheon (KR); Korea University Research and Business Foundation, Seoul (KR)

(72) Inventors: Seonwook Kim, Namyangju (KR); Wonjun Lee, Seoul (KR); Changhyun Kim, Seongnam (KR)

(73) Assignees: SK hynix Inc, Icheon (KR); Korea University Research and Business Foundation, Seoul (KR)

( * ) Notice: Subject to any disclaimer, the term of this patent is extended or adjusted under 35 U.S.C. 154(b) by 1001 days.

(21) Appl. No.: 17/401,201

(22) Filed: Aug. 12, 2021

(65) Prior Publication Data

US 2022/0157371 A1 May 19, 2022

(30) Foreign Application Priority Data

Nov. 16, 2020 (KR) .......................... 10-2020-0152938

(51) Int. Cl.
*G06F 7/544* (2006.01)
*G06F 7/50* (2006.01)
(Continued)

(52) U.S. Cl.
CPC .............. *G06F 7/5443* (2013.01); *G06F 7/50* (2013.01); *G06F 7/523* (2013.01); *G06F 15/7821* (2013.01)

(58) Field of Classification Search
CPC ........ G06F 15/7821; G06F 7/50; G06F 7/523; G06F 7/5443; G11C 7/10; G11C 7/1006; G11C 7/1078; G11C 7/1084–109; G11C 8/00; G11C 8/06; G11C 8/10–12; G06G 7/14–16; G06G 7/19; G06G 7/1928
See application file for complete search history.

(56) References Cited

U.S. PATENT DOCUMENTS 5,953,738 A * 9/1999 Rao ...................... G11C 7/1006
711/E12.041
9,898,252 B2 2/2018 Tiwari
(Continued)

FOREIGN PATENT DOCUMENTS

| KR | 1020180042111 A | 4/2018 |
| KR | 10-2020-0057475 A | 5/2020 |
| KR | 10-2020-0108773 A | 9/2020 |

*Primary Examiner* — Matthew D Sandifer

(57) ABSTRACT

A semiconductor device includes a memory cell array, an address input circuit, a command input circuit, a data Input/Output (IO) circuit, a processing control circuit, a processing circuit, and a switch circuit. The processing control circuit includes a register array storing an address of an operand and determines whether an address provided from the address input circuit corresponds to the address stored in the register array. The processing circuit is configured to provide a processing result by performing an operation on data provided from the memory cell array. The switch circuit is configured to control a data path among the processing circuit, the data IO circuit, and the memory cell array and controls the data path to connect the memory cell array to the processing circuit when the address provided from the address input circuit corresponds to the address stored in the register array.

15 Claims, 13 Drawing Sheets

(51) Int. Cl.
*G06F 7/523* (2006.01)
*G06F 15/78* (2006.01)

(56) References Cited

U.S. PATENT DOCUMENTS

| | | | | |
|---|---|---|---|---|
| 2020/0293319 A1* | 9/2020 | Lee | ............ | G06F 9/321 |
| 2020/0294558 A1* | 9/2020 | Yu | ............ | G11C 11/409 |
| 2021/0373805 A1* | 12/2021 | Alsop | ............ | G06F 3/0629 |
| 2023/0400985 A1* | 12/2023 | Kim | ............ | G06F 15/7821 |
| 2023/0418474 A1* | 12/2023 | Kim | ............ | G06F 3/0673 |

* cited by examiner

<Prior Art>

FIG. 7

| Bank | 0 | 1 | 2 | ... | 15 |
|---|---|---|---|---|---|
| 1st Matching Flag (MF1) | | | | ... | |
| 2nd Matching Flag (MF2) | | | | ... | |
| 3rd Matching Flag (MF3) | | | | ... | |

| Processing | | Setting Signal (D) |
|---|---|---|
| MAC | c = a x b + ACC | 0 0 0 0 |
| MUL | c = a x b + 0 | 0 0 1 0 |
| ADD | c = a x 1 + b | 0 1 0 1 |
| SUB | c = a x 1 - b | 1 1 0 1 |

SEMICONDUCTOR DEVICE CAPABLE OF PERFORMING IN-MEMORY PROCESSING

CROSS-REFERENCE TO RELATED APPLICATION

The present application claims priority under 35 U.S.C. § 119(a) to Korean Patent Application No. 10-2020-0152938, filed on Nov. 16, 2020, which is incorporated herein by reference in its entirety.

BACKGROUND

1. Technical Field

Various embodiments generally relate to a semiconductor device capable of performing in-memory processing with conventional memory commands.

2. Related Art

A technology for performing an operation inside a semiconductor device is being developed, and this operation is referred to as in-memory processing (IMP) or processing in-memory (PIM).

FIG. 1 illustrates a conventional memory system.

Conventionally, a memory controller 2 provides a specially prepared command for the IMP operation to the semiconductor device 1. In this case, the semiconductor device 1 is, for example, a memory device.

For a special IMP command, a separate bus 5 is provided between the memory controller 2 and the semiconductor device 1 in addition to a conventional command and address bus 3 and a data bus 4 as shown in FIG. 1.

In this case, since the design of the memory controller 2 needs to be changed and a separate bus is required in the system, it is difficult to apply in-memory processing to an existing system as it is.

SUMMARY

In accordance with an embodiment of the present disclosure, a semiconductor device may include a memory cell array; an address input circuit; a command input circuit; a data Input/Output (IO) circuit; a processing control circuit including a register array storing an address of an operand; a processing circuit configured to provide a processing result by performing an operation on data provided from the memory cell array; and a switch circuit configured to control a data path among the processing circuit, the data IO circuit, and the memory cell array, wherein the processing control circuit determines whether an address provided from the address input circuit corresponds to an address stored in the register array, and wherein the switch circuit controls the data path to connect the memory cell array to the processing circuit when an address provided from the address input circuit corresponds to an address stored in the register array.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

FIG. 7 illustrates a data structure of a matching table according to an embodiment of the present disclosure.

FIG. 9 is a table showing operation modes of a processing circuit according to an embodiment of the present disclosure.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of teachings of the present disclosure. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 1:
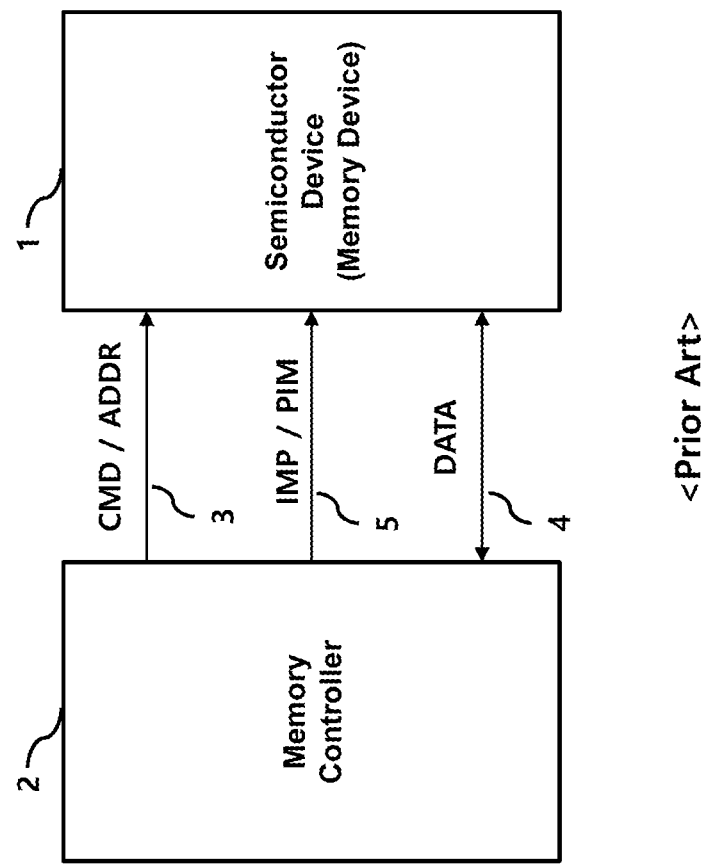
FIG. 1 illustrates a conventional memory system.
Figure 2:
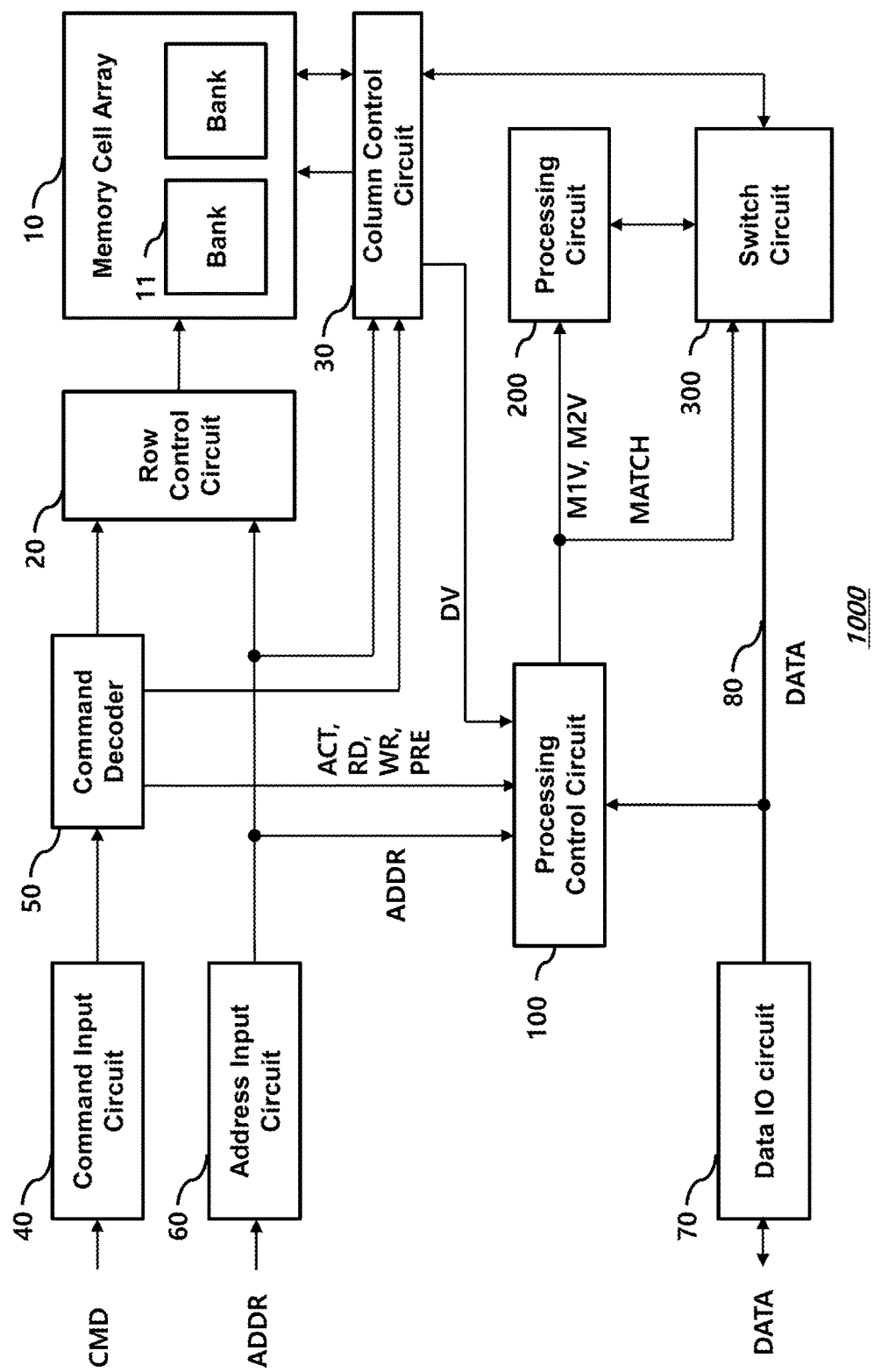
FIG. 2 illustrates a semiconductor device according to an embodiment of the present disclosure.

FIG. 2 is a block diagram illustrating a semiconductor device 1000 according to an embodiment of the present disclosure.

Hereinafter, the semiconductor device 1000 will be described using a memory device as an example, but the embodiments are not limited thereto.

The semiconductor device 1000 includes a memory cell array 10, a row control circuit 20, a column control circuit 30, a command input circuit 40, a command decoder 50, an address input circuit 60, a data input/output (IO) circuit 70, and a data bus 80.

The memory cell array 10 may include a plurality of banks 11.

The above elements of the semiconductor device 1000 are also included in a conventional memory device, and read or write operations can be performed by the semiconductor device 1000 as they are conventionally performed in the related arts.

Accordingly, detailed descriptions of these operations will not be repeated.

The semiconductor device 1000 according to an embodiment of the present disclosure performs an in-memory processing (IMP) using a conventional read command, a conventional write command, or combinations thereof.

To this end, the semiconductor device 1000 further includes a processing control circuit 100, a processing circuit 200, and a switch circuit 300.

The semiconductor device 1000 may perform a designated processing operation on operands stored in the memory cell array 10.

The semiconductor device 1000 may store a processing result in the memory cell array 10.

An address in which an operand is stored, an address in which a processing result is stored, a type of processing, etc. may be stored in advance in the processing control circuit 100 by a conventional memory write operation.

In this case, a write operation may use a predetermined address. In a write command to the predetermined address, data from the data IO circuit 70 may be stored in a register array of the processing control circuit 100.

In this case, the predetermined address must be known in advance to an operating system that controls the semiconductor device 1000 via a memory controller.

When a read operation is performed on an operand, the processing circuit 200 may perform a predetermined in-memory processing in response to the read operation.

Whether a read operation is being performed on the operand may be determined using information on an address of the operand stored in a register.

In this case, data read from the memory cell array 10 is provided to the processing circuit 200 without being output through the data IO circuit 70.

A processing result output from the processing circuit 200 is stored in the memory cell array 10.

Whether a write operation of a processing result is being performed may be determined using information on an address to store a processing result stored in the register. In this case, the data output from the processing circuit 200 is provided to the memory cell array 10 instead of data from the data IO circuit 70.

Specific operations will be described in detail below.

Figure 3:
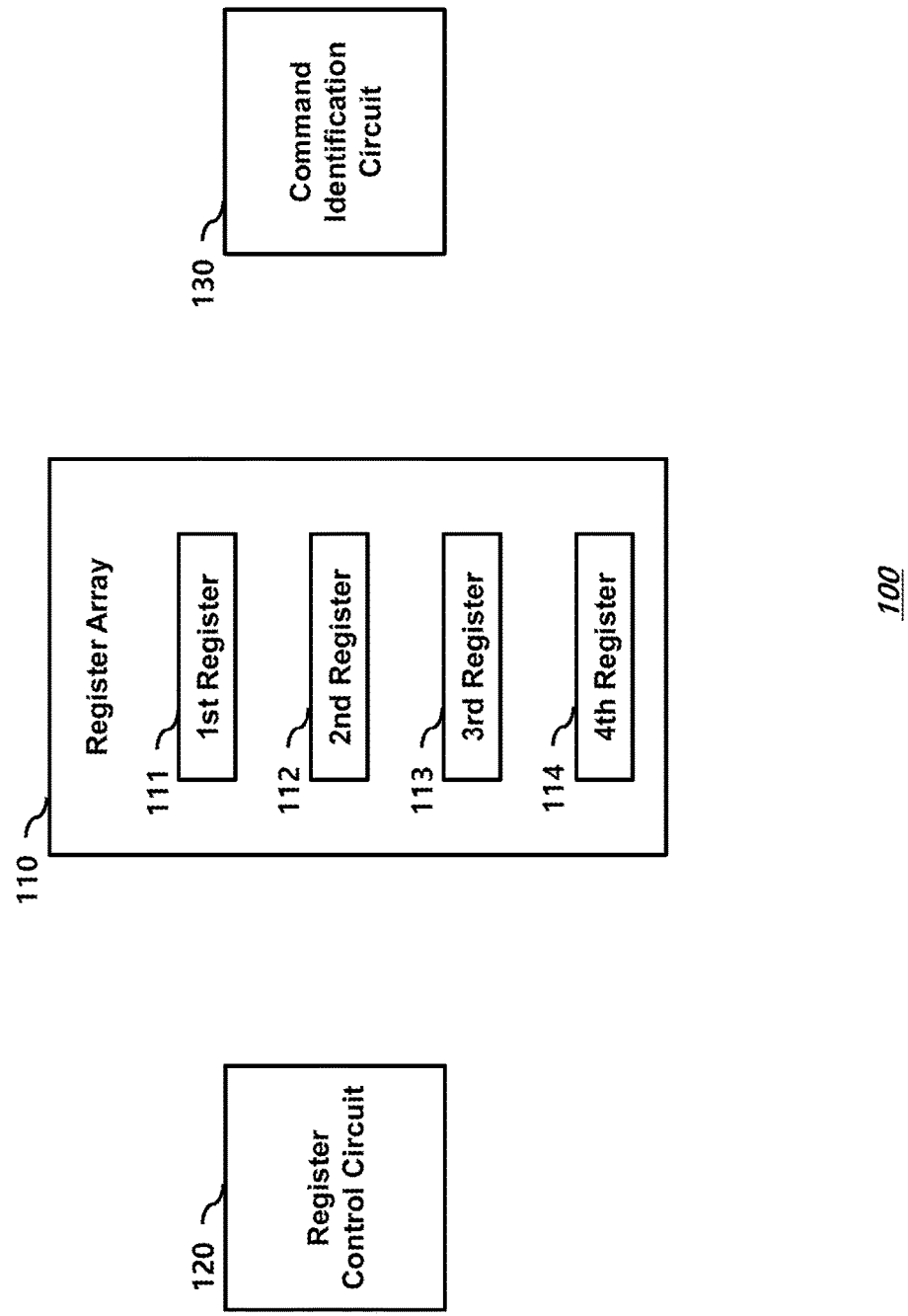
FIG. 3 illustrates a processing control circuit according to an embodiment of the present disclosure.

FIG. 3 illustrates the processing control circuit 100 according to an embodiment of the present disclosure.

The processing control circuit 100 includes a register array 110, a register control circuit 120, and a command identification circuit 130.

The register array 110 includes first to fourth registers 111 to 114.

In this embodiment, the first register 111 and the second register 112 each stores an address of a respective operand.

In this embodiment, the third register 113 stores an address for storing a processing result.

Each of the first to third registers 111 to 113 may store an address or a range of addresses.

In this embodiment, the fourth register 114 stores processing information for setting a type of processing of the processing circuit 200.

The processing circuit 200 may perform various processing operations according to information set in the fourth register 114.

For example, the processing circuit 200 may perform an addition operation, a subtraction operation, a multiplication operation, or a multiplication and accumulation (MAC) operation, etc. according to information set in the fourth register 114.

The fourth register 114 may further store flags indicating whether values stored in the first to third registers 111 to 113 are valid.

The addresses of the first to fourth registers 111 to 114 may be predetermined addresses and may be known in advance to an operating system that controls the semiconductor device 1000 via a memory controller.

Figure 4:
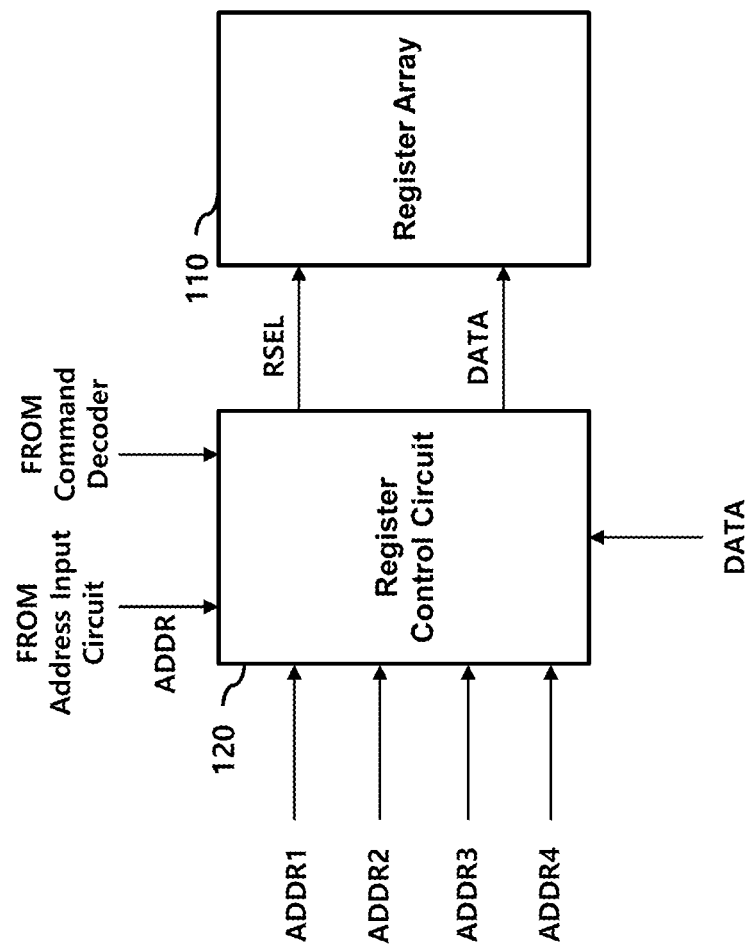
FIG. 4 illustrates a register control circuit according to an embodiment of the present disclosure.

FIG. 4 is a block diagram illustrating a register control circuit 120 according to an embodiment of the present disclosure.

The register control circuit 120 compares the first to fourth register addresses ADDR1 to ADDR4 with an address ADDR input from the address input circuit 60 and controls a write operation on the first to fourth register addresses 111 to 114.

As described above, the first to fourth register addresses ADDR1 to ADDR4 may be predetermined addresses.

The first to fourth register addresses ADDR1 to ADDR4 may be fixed in a hard-wired manner. For example, they may have fixed values as shown in the following table 1.

TABLE 1

|  | Row address | Column Address |
| --- | --- | --- |
| ADDR1 | 0 | 0 |
| ADDR2 | 0 | 1 |
| ADDR3 | 0 | 2 |
| ADDR4 | 0 | 3 |

As described above, an operating system that controls the semiconductor device via a memory controller needs to know the first to fourth register addresses ADDR1 to ADDR4 in advance.

In another embodiment, the first to fourth register addresses ADDR1 to ADDR4 may be set during an initialization step of the semiconductor device 1000.

For example, a memory controller may set values of the first to fourth register addresses ADDR1 to ADDR4 in a mode register using a conventional mode register setting technique.

In this case, the first to fourth register addresses ADDR1 to ADDR4 input to the register control circuit 120 may be provided from the mode register.

The register control circuit 120 determines whether the address provided by the address input circuit 60 of FIG. 2 is the same as any of the first to fourth register addresses ADDR1 to ADDR4 and when it is generates a register selection signal RSEL to select a corresponding one of the first to fourth registers 111.

The register selection signal RSEL may be used as a write enable signal for the first to fourth registers 111 to 114.

The register control circuit 120 may write data provided from the data IO circuit 70 into a selected register according to a write command provided from the command decoder 50.

For example, the register control circuit 120 may write data to a register when a command provided from the command decoder 50 is a write command.

The first to fourth register addresses ADDR1 to ADDR4 are addresses allocated to the register array 110, and a corresponding region of the memory cell array 10 is not used.

Accordingly, when a read or write operation on the register array 110 is performed, the read or write operation on the memory cell array 10 may be performed as well, as in the related arts.

As shown in FIG. 2, a plurality of banks are included in the memory cell array 10, and in an embodiment a plurality of processing circuits 200 may be provided so that a bank can transmit and receive data to a corresponding processing circuit 200.

In FIG. 2, only one processing circuit 200 is illustrated, which corresponds to the bank 11.

In the present embodiment, only one register array 110 may exist, and in this case, information stored in the register array 110 may be commonly applied to all banks and all processing circuits.

In another embodiment, as many register arrays 110 as the number of banks may exist, and one register array 110 may be used only for one processing circuit 200.

In such an embodiment, the register array 110 may be independently set for each bank or each processing circuit.

Figure 5:
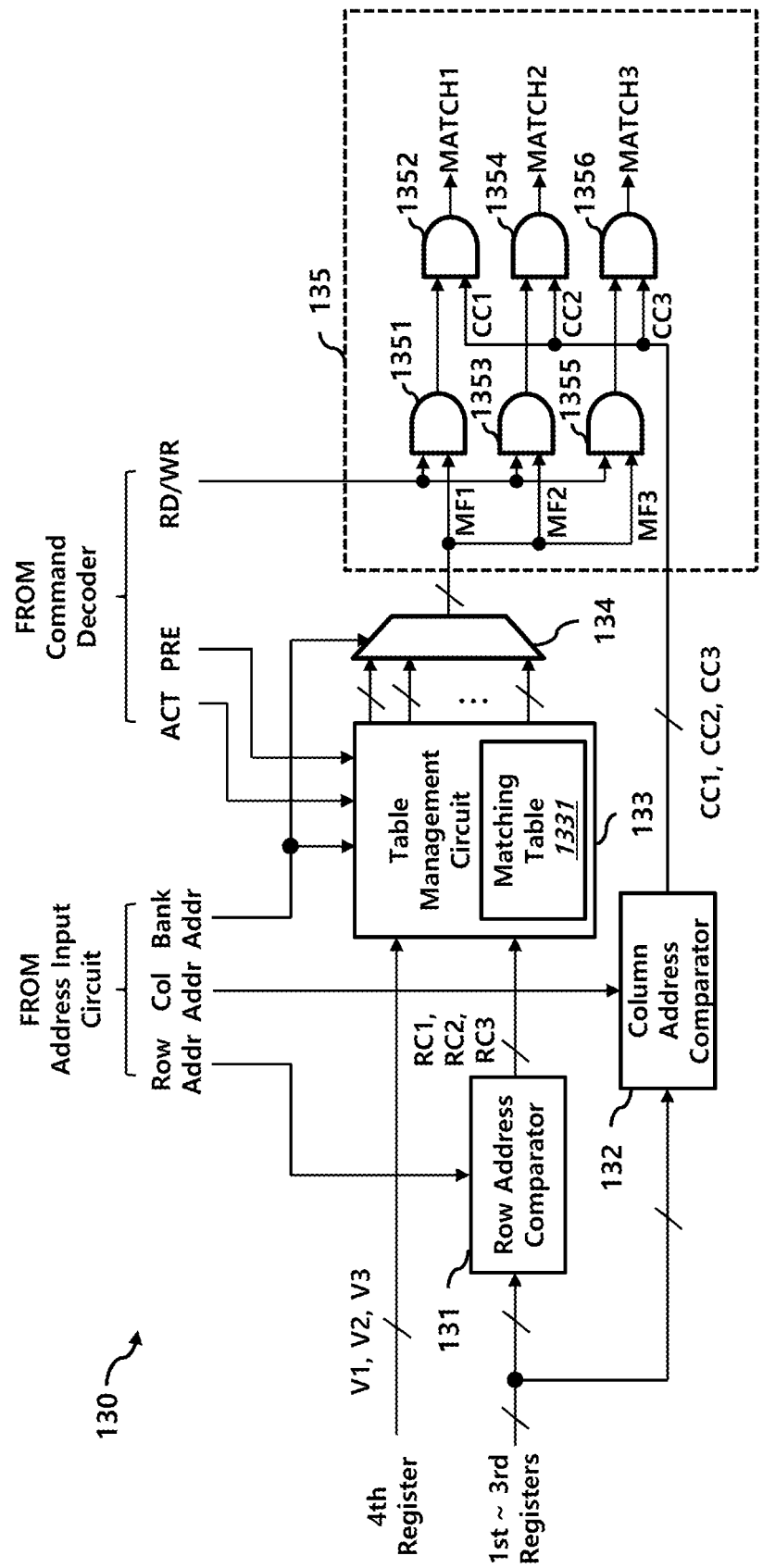
FIG. 5 illustrates a command identification circuit according to an embodiment of the present disclosure.

FIG. 5 is a block diagram illustrating components of a command identification circuit 130 according to an embodiment of the present disclosure. Additional components of the command identification circuit 130 are illustrated in FIG. 6.

Figure 6:
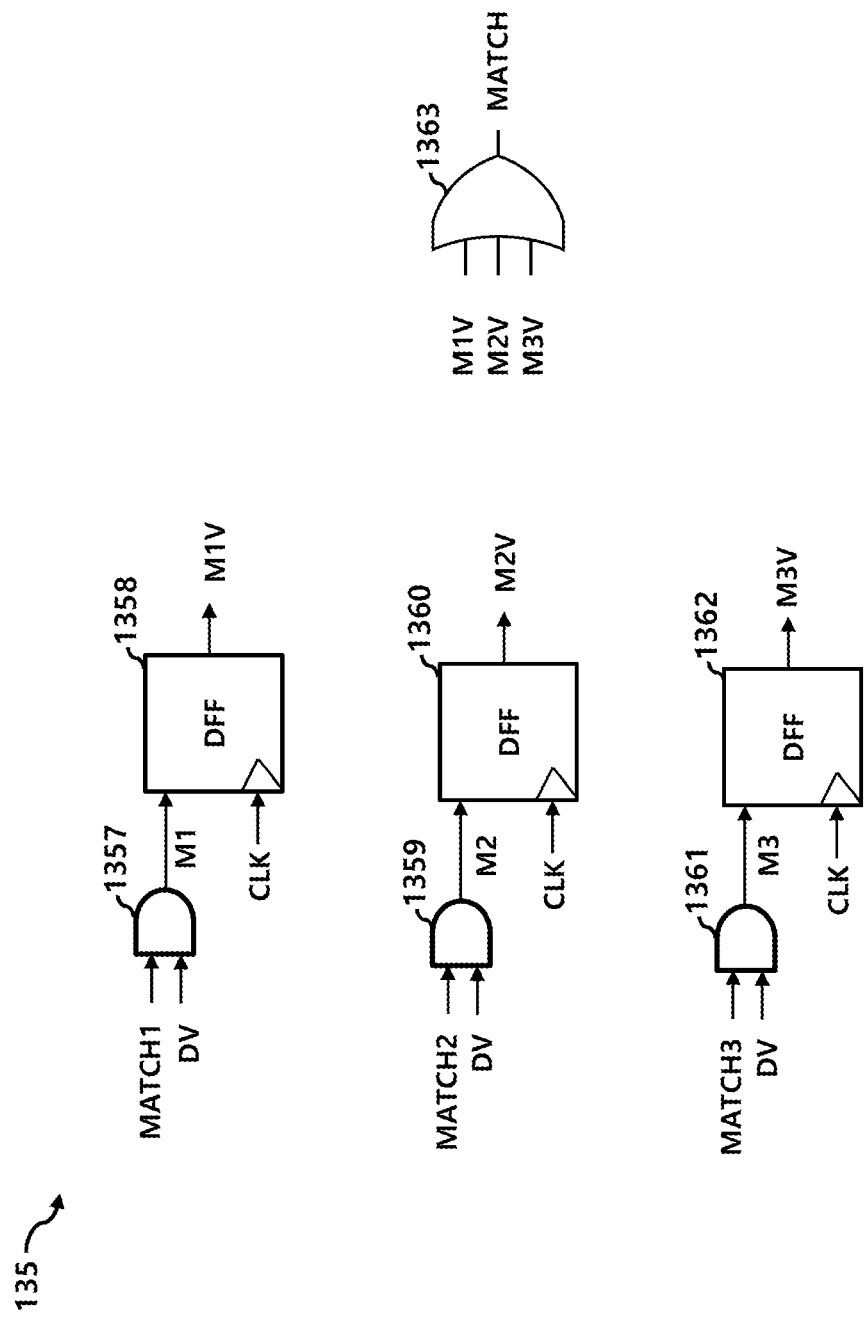
FIG. 6 illustrates additional elements included in a control signal generating circuit according to an embodiment of the present disclosure.

The command identification circuit 130 generates a match signal MATCH, shown in FIGS. 2 and 6, with reference to an address provided from the address input circuit 60 of FIG. 2, a command provided from the command decoder 50 of FIG. 2, and information provided from the register array 110 of FIG. 3.

The match signal MATCH indicates whether a read or write command is for in-memory processing or not.

The command identification circuit 130 includes a row address comparator 131, a column address comparator 132, a table management circuit 133, a bank selection circuit 134, and a control signal generating circuit 135.

The row address comparator 131 and the column address comparator 132 may be collectively referred to as an address comparing circuit.

The row address comparator 131 compares a row address provided from the address input circuit 60 with an address or an address range stored in the first to third registers 111 to 113.

For example, the row address comparator 131 outputs the first row comparison signal RC1 by determining whether a row address provided from the address input circuit 60 is the same as an address or included in an address range stored in the first register 111.

Also, the row address comparator 131 outputs the second row comparison signal RC2 by determining whether a row address provided from the address input circuit 60 is the same as an address or included in an address range stored in the second register 112.

Also, the row address comparator 131 outputs the third row comparison signal RC3 by determining whether a row address provided from the address input circuit 60 is the same as an address or included in an address range stored in the third register 113.

The column address comparator 132 compares a column address provided by the address input circuit 60 with an address or an address range stored in the first to third registers 111 to 113.

For example, the column address comparator 132 outputs the first column comparison signal CC1 by determining whether a column address provided from the address input circuit 60 is the same as an address or included in an address range stored in the first register 111.

Also, the column address comparator 132 outputs the second column comparison signal CC2 by determining whether a column address provided from the address input circuit 60 is the same as an address or included in an address range stored in the second register 112.

Also, the column address comparator 133 outputs the third column comparison signal CC3 by determining whether a column address provided from the address input circuit 60 is the same as an address or included in an address range stored in the third register 113.

The table management circuit 133 manages a matching table 1331 storing first to third matching flags for a plurality of banks.

FIG. 7 shows a data structure of a matching table 1331 according to an embodiment of the present disclosure.

The matching table 1331 stores the first to third matching flags MF1, MF2, and MF3 corresponding to each bank. In this embodiment, it is assumed that there are 16 banks.

The table management circuit 133 sets a matching flag corresponding to a corresponding bank with reference to the bank address.

The first matching flag MF1 corresponds to the first row comparison signal RC1, the second matching flag MF2 corresponds to the second row comparison signal RC2, and the third matching flag MF3 corresponds to the third row comparison signal RC3.

The table management circuit 133 may additionally refer to the active command ACT and the precharge command PRE output from the command decoder 50 to set the value of the first to third matching flags.

For example, when the active command ACT is applied, the value of the first matching flag MF1 stores the first row comparison signal RC1 as it is, and when the precharge command PRE is applied, the value of the first matching flag MF1 is inactivated.

The table management circuit 133 may additionally refer to information in the fourth register 114 to set a value of the matching flag.

As described above, the fourth register 114 may further store first to third valid flags indicating whether the values stored in the first to third registers 111 to 113 are valid in addition to the information for controlling the processing circuit 200.

For example, the table management circuit 133 may set the first matching flag to a low level when the first valid flag is inactivated even though the first row comparison signal RC1 is at a high level.

The bank selection circuit 134 selects and outputs the first to third matching flags MF1, MF2 and MF3 corresponding to a bank address.

The control signal generating circuit 135 generates a plurality of control signals for controlling the processing circuit 200 and the switch circuit 300 with reference to a read command RD or a write command WR output from the command decoder 50 and an output of the column address comparator 132. In the embodiment shown in FIG. 5, the control signal generating circuit 135 receives a read/write signal RD/WR that is asserted whenever the read command RD or the write command WR is output from the command decoder 50. The read/write signal RD/WR is provided to first inputs of each of first, third, and fifth AND gates 1351, 1353, and 1355. The first, second, and third matching flags MF1, MF2, and MF3 are respectively provided to second inputs of the first, third, and fifth AND gates 1351, 1353, and 1355. The first, second, and third column comparison signals CC1, CC2, and CC3 and outputs of the first, third, and fifth AND gates 1351, 1353, and 1355 are provided to the second, fourth, and sixth AND gates 1352, 1354, and 1356 which produce the first, second, and third match signals MATCH1, MATCH2, and MATCH3, respectively.

Hereinafter, the control signal generating circuit 135 is describe in detail with reference to the circuit diagrams of FIGS. 5 and 6 and the timing diagrams of FIGS. 11 and 12.

The first match signal MATCH1 has the same logic level as the first matching flag MF1 when a read or write command is applied and the first column comparison signal CC1 is activated.

Figure 11:
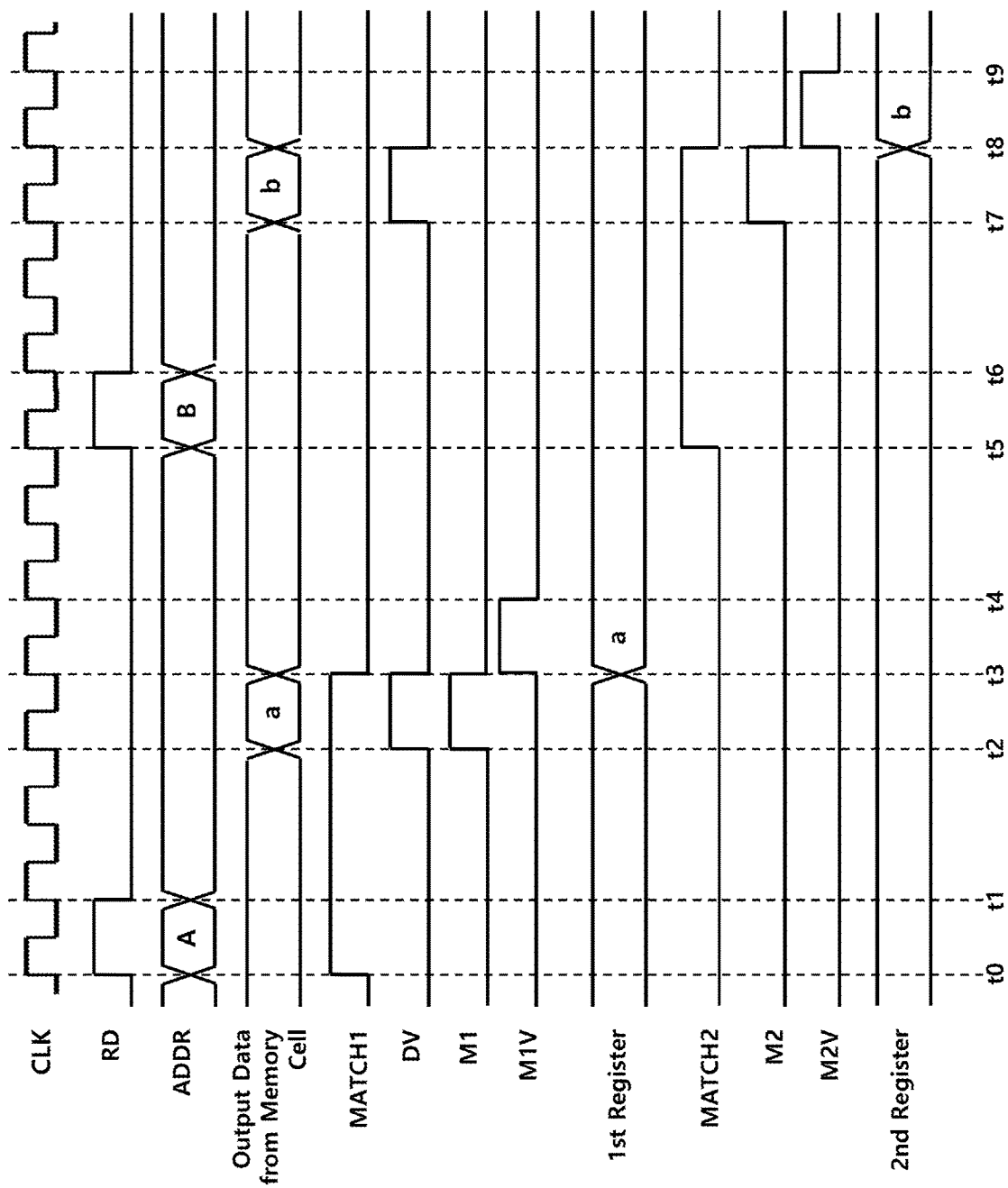
FIGS. 11 and 12 are timing diagrams showing in-memory processing operations of a semiconductor device of according to an embodiment of the present disclosure.

For example, in FIG. 11, the first match signal MATCH1 is activated during a period between t0 and t1 in which the read command RD is activated and an address A that is the same as that stored in the first register 111 is applied by the address input circuit 60.

Since the second match signal MATCH2 and the third match signal MATCH3 are generated similarly, the description thereof will not be repeated.

The control signal generating circuit 135 may additionally use the valid data signal DV.

The valid data signal DV indicates, for example, that a valid signal is output from a sense amplifier of a bank 11 or a valid signal is applied to the sense amplifier.

For example, in FIG. 11, a period between t2 and t3 represents a period in which valid data is output from the bank 11 according to the read command RD applied at t0.

The valid data signal DV can be produced in the column control circuit 30 by selecting a signal from signals used for driving the sense amplifier and a bit line driver, which can be easily implemented by those skilled in the art without undue experimentation, and accordingly detailed description thereof will be omitted.

The control signal generating circuit 135 generates a first register enable signal M1V, a second register enable signal M2V, and a third register enable signal M3V.

The first register enable signal M1V activates the first operand register 211 included in the processing circuit 200, and the second register enable signal M2V activates the second operand register 212 included in the processing circuit 200. This will be discussed in detail with respect to FIG. 10.

The first register enable signal M1V activates the first operand register 211 to latch data when the first match signal MATCH1 and the valid data signal DV are activated.

For example, in FIG. 11, a period between t2 and t3 is a period in which the first match signal MATCH1 and the valid data signal DV are activated, and the first register enable signal M1V is activated to latch data in a period between t3 and t4.

The second register enable signal M2V activates the second operand register 212 to latch data when the second match signal MATCH2 and the valid data signal DV are activated.

For example, in FIG. 11, the period t7 to t8 is a period in which the second match signal MATCH2 and the valid data signal DV are activated, and the second register enable signal M2V is activated to latch the data in a period between t8 and t9.

The third register enable signal M3V activates when the third match signal MATCH3 and the valid data signal DV are activated. Activation of any one of the first, second, or third register enable signals M1V, M2V, or M3V causes the match signal MATCH to activate, as described below.

Various design changes are possible using a logic circuit to generate the first register enable signal M1V, the second register enable signal M2V, and the third register enable signal M3V.

For example, in the present embodiment, an AND gate 1357 that outputs the first signal M1 by performing an AND operation on the first match signal MATCH1 with the valid data signal DV and a flip-flop 1358 that latches the first signal M1 according to the clock signal CLK to output the first register enable signal M1V are used.

The clock signal CLK may be generated from an internal clock signal that controls the operation of the memory device which may be a synchronous dynamic random access memory (DRAM).

In the same way, the second signal M2, the third signal M3, the second register enable signal M2V, and the third register enable signal M3V can be generated. For this, AND gates 1359 and 1361 and flip flops 1360 and 1362 are used. Descriptions thereof are obvious from the above description and will not be repeated.

In this embodiment, a match signal MATCH is additionally generated.

In this embodiment, activation of the match signal MATCH indicates that a read or write command for a corresponding bank is being used for in-memory processing.

The match signal MATCH controls the switch circuit 300 to change a data transfer path among the processing circuit 200, the data IO circuit 80, and the memory cell array 10.

When the match signal MATCH is activated, the switch circuit 300 couples a data line of the bank 11 with the processing circuit 200, and when the match signal MATCH is inactivated, the switch circuit 300 couples a data line of the bank 11 with the data IO circuit 70.

Accordingly, when a read command for in-memory processing is performed, one of the first or second register enable signals M1V or M2V activates, which causes the match signal MATCH to activate, and as a result data output from the bank 11 is provided to the processing circuit 200. When a write command for in-memory processing is performed, the third register enable signal M3V activates, which causes the match signal MATCH to activate, and as a result data output from the accumulation register 280 of the processing circuit 200 is provided to the bank 11.

In the present embodiment, an OR gate 1363 is further included to generate the match signal MATCH by performing OR operation on the first register enable signal M1V, the second register enable signal M2V, and the third register enable signal M3V.

Figure 8:
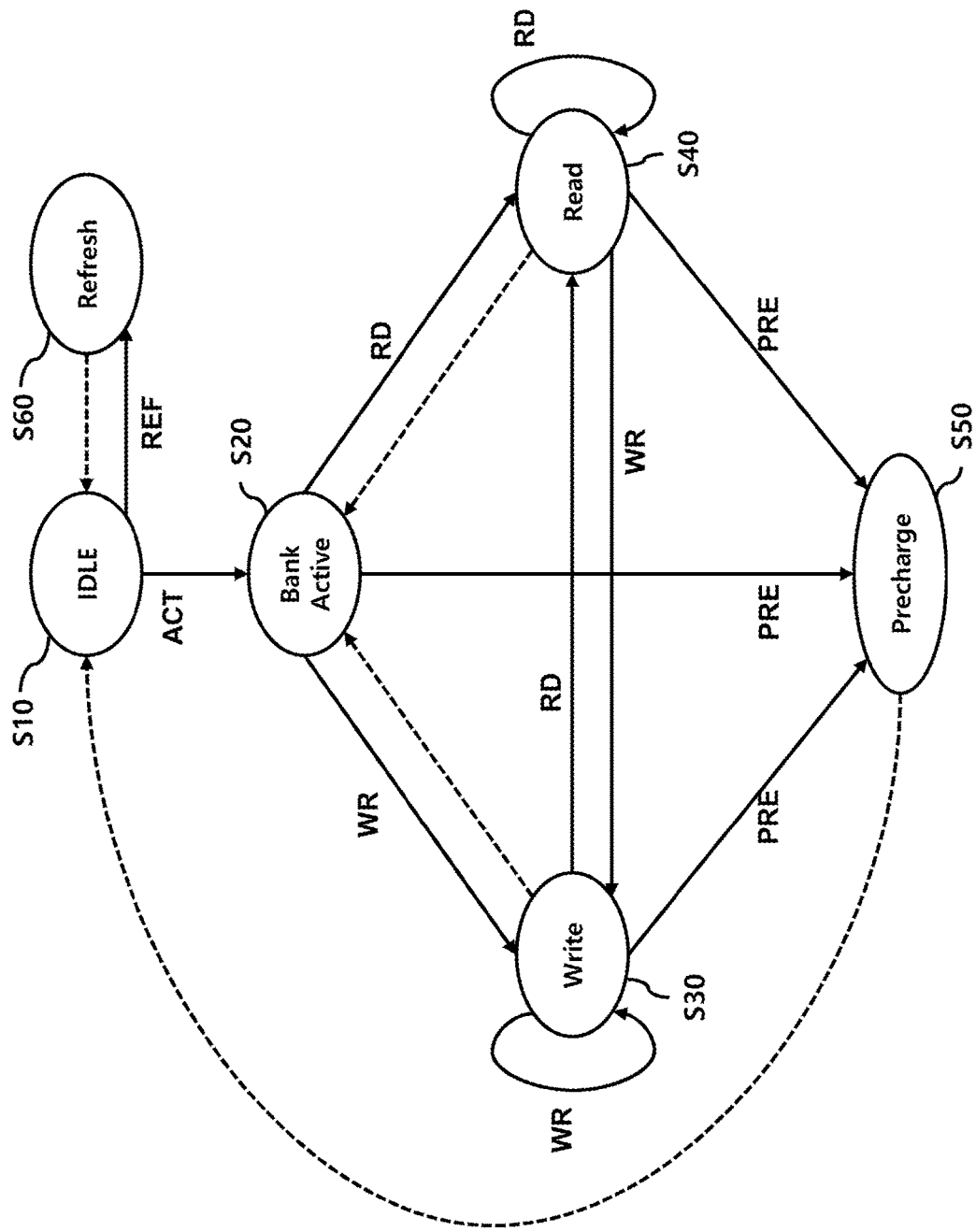
FIG. 8 is a state diagram showing operation of a semiconductor device according to an embodiment of the present disclosure.

FIG. 8 is a state diagram illustrating an operation of the semiconductor device 1000 according to an embodiment of the present disclosure.

The operating states of the semiconductor device 1000 include an idle state S10, a bank active state S20, a write state S30, a read state S40, a precharge state S50, and a refresh state S60.

In FIG. 8, a solid line indicates a path through which a state transitions when a corresponding command is applied, and a dotted line indicates a path through which a state automatically transitions when a predetermined time elapses.

Commands that cause state transitions include an active command ACT, a write command WR, a read command RD, a refresh command REF, and a precharge command PRE.

Since the state diagram of FIG. 8 itself is substantially the same as the state diagram of a conventional synchronous DRAM, a detailed description will not be repeated.

This indicates that the semiconductor device 1000 of the present embodiment does not require a special state or a special command for in-memory processing.

As described above, in the write state S30, a write operation may be performed on the register array 110 using a predetermined address.

FIG. 9 is a table showing an operation mode of the processing circuit 200 according to a setting signal, and FIG.

10 is a block diagram illustrating the processing circuit 200 according to an embodiment of the present disclosure.

The setting signal D is stored in the fourth register 114 through the register setting operation as described above.

As illustrated in FIG. 9, when the setting signal D is "0000", the processing circuit 200 performs a multiplication and accumulation (MAC) operation, and when the setting signal D is "0010", the processing circuit 200 performs a multiplication (MUL) operation, when the setting signal D is "0101", the processing circuit 200 performs an addition (ADD) operation, and when the setting signal D is "1101", the processing circuit 200 performs a subtraction (SUB) operation. While FIG. 9 shows only four operations that may be performed by the processing circuit 200, embodiments are not limited thereto.

Figure 10:
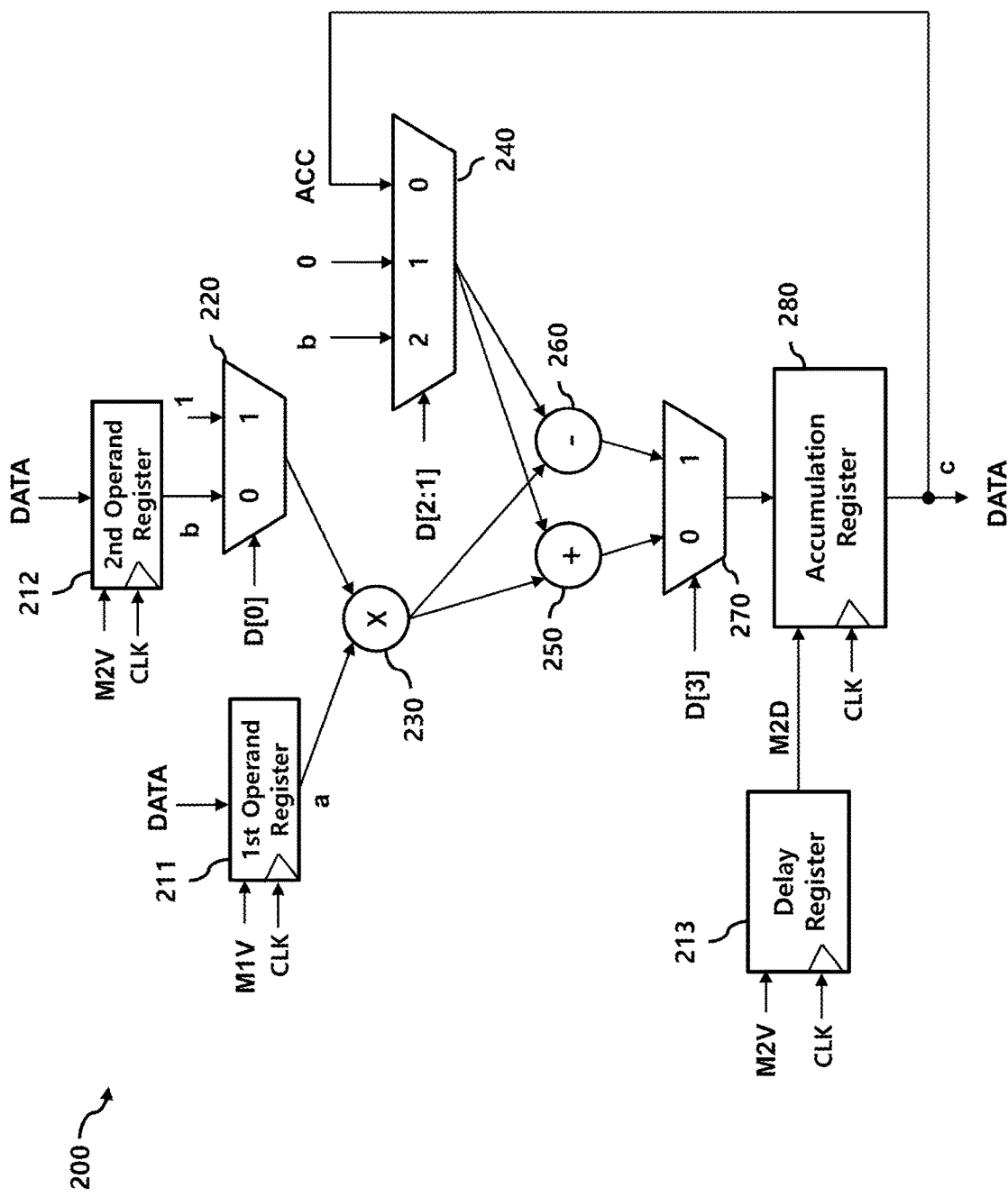
FIG. 10 illustrates a processing circuit according to an embodiment of the present disclosure.

An example of the processing circuit 200 will be described with reference to FIG. 10.

In FIGS. 8 and 9, a and b represent operands, and c represents a processing result.

The operand a is stored in the address A provided from the address input circuit 60. At this time, the address A provided from the address input circuit 60 is included in an address or an address range stored in the first register 111.

The operand b is stored in the address B provided from the address input circuit 60. At this time, the address B provided from the address input circuit 60 is included in an address or an address range stored in the second register 112.

The operands a and b are output from the memory cell array 10 to the processing circuit 200 by respective read commands.

The processing result c is stored in the address C provided from the address input circuit 60 by a write command.

At this time, the address C provided from the address input circuit 60 is included in an address or an address range stored in the third register 113.

The processing circuit 200 includes a first operand register 211 for storing the operand a and a second operand register 212 for storing the operand b.

The first operand register 211 latches data provided from the memory cell array 10 in synchronization with the clock signal CLK.

The first operand register 211 is activated according to the first register enable signal M1V.

In FIG. 11, the first register enable signal M1V is activated between t2 and t3, and data a output from the memory cell array 10 at t3 is stored in the first operand register 211.

Data a stored in the first operand register 211 may be referred to as a first operand a.

The second operand register 212 is activated according to the second register enable signal M2V.

In FIG. 11, the second register enable signal M2V is activated between t7 and t8 and data b output from the memory cell array 10 at t8 is stored in the second operand register 212.

Data b stored in the second register 212 may be referred to as a second operand b.

The arithmetic circuit 200 includes a first selection circuit 220 that outputs the second operand b or 1 according to a setting signal D[0], a multiplier 230 that multiplies the first operand a with an output of the first selection circuit 210, a second selection circuit 240 that outputs the second operand b, 0, or an accumulated value ACC according to a setting signal D[2:1], an adder 250 for adding an output of the second selection circuit 240 with an output of the multiplier 230, a subtractor 260 for subtracting an output of the second selection circuit 240 from an output of the multiplier 230, and a third selection circuit 270 that selects the output of the adder 250 or the output of the subtractor 260 according to a setting signal D[3], and an accumulation register 280 that accumulates the output of the third selection circuit 270 to generate the accumulated value ACC.

The output of the accumulation register 280 corresponds to the operation result c.

The processing circuit 200 further includes a delay register 213.

The delay register 213 operates in synchronization with the clock signal CLK, but activation is controlled according to the second register enable signal M2V.

The output signal M2D of the delay register 213 has a form in which the second register enable signal M2V is delayed for a predetermined time.

The delay time of the delay register 213 is set in consideration of a time sufficient for a processing operation of the processing circuit 200. In this embodiment, the delay time corresponds to one cycle of the clock signal CLK.

Figure 12:
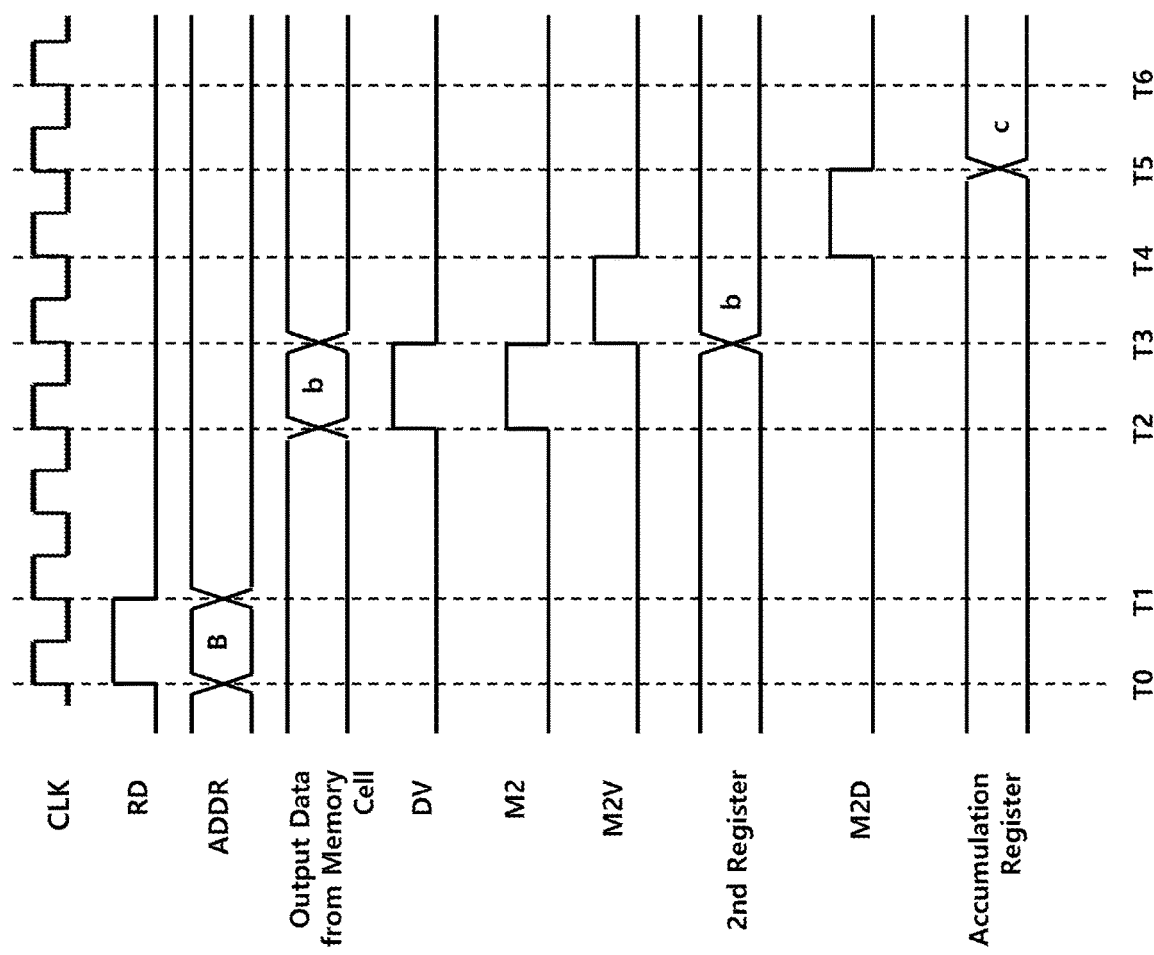

That is, in response to the second register enable signal M2V activated between T3 and T4 of FIG. 12, the delay register 213 outputs an activated signal between T4 and T5.

T2 in FIG. 12 corresponds to t7 in FIG. 11.

The accumulation register 280 accumulates the output of the third selection circuit 270 to a previously stored value in synchronization with the clock signal CLK when the output signal M2D of the delay register 213 is activated.

When the setting signal D in the fourth register 114 is "0 00 0", as shown in FIG. 9, the first selection circuit 220 selects the second operand b, the second selection circuit 240 selects the accumulated value ACC, and the third selection circuit 270 selects the output of the adder 250.

Accordingly, the processing result c becomes a value obtained by adding the product of the two operands a and b to the accumulated value ACC.

Since a person skilled in the art can easily recognize that values selected by the first to third selection circuits is changed according to the setting signal D to perform processing set the operation as set in FIG. 9, a detailed description of the remaining operations will be omitted.

Figure 13:
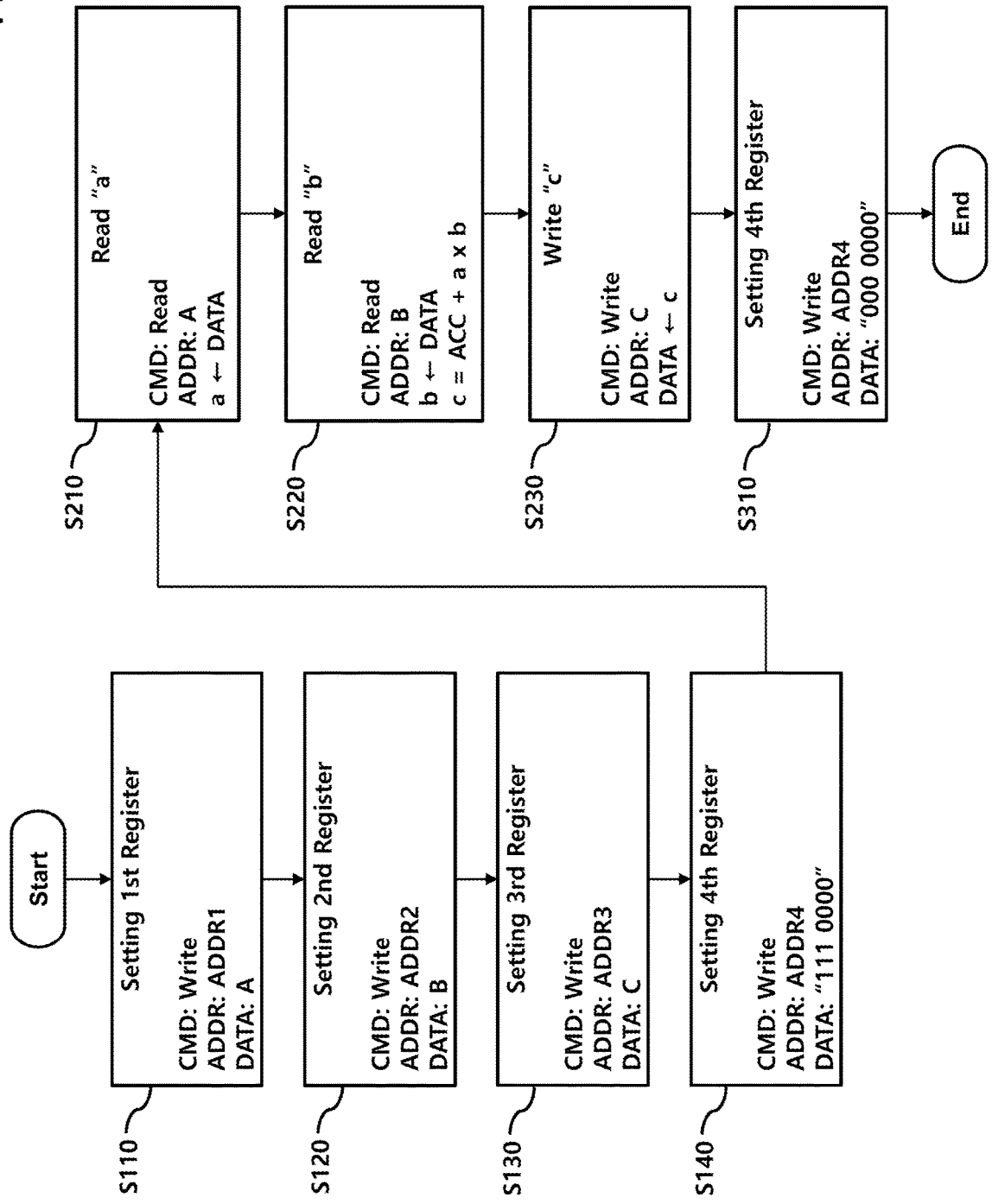
FIG. 13 illustrates an in-memory processing operation of a semiconductor device according to an embodiment of the present disclosure.

FIG. 13 is a flowchart illustrating processing a MAC operation in the semiconductor device 1000 according to an embodiment of the present disclosure.

The in-memory processing may include preparation steps S110 to S140, processing steps S210 to S230, and a termination step S310.

The preparation step includes an operation of setting the register array 110.

First, a first register 111 is set at S110.

To this end, the memory controller sets a type of request as a write request, an address as the first register address ADDR1, and a data DATA as the address A of the first operand a or an address range including the address A, and provides the write request to the semiconductor device 1000.

Next, a second register 112 is set at S120.

To this end, the memory controller sets a type of request as a write request, an address as the second register address ADDR2, and a data DATA as the address B of the second operand b or an address range including the address B, and provides the write request to the semiconductor device 1000.

Next, a third register 113 is set at S130.

To this end, the memory controller sets a type of request as a write request, an address as the address of the third register ADDR3, and a data DATA as the address C of the processing result c or an address range including the address C, and provides the write request to the semiconductor device 1000.

Next, a fourth register 114 is set at S140.

To this end, the memory controller sets a type of request as a write request, an address as the fourth register address ADDR4, and a data DATA as "111 0000", and provides the write request to the semiconductor device 1000.

Among the data, the upper 3 bits "111" indicate respectively indicate that the first to third registers 111, 112, and 113 are valid, and the lower 4 bits "0000" indicate the setting signal D to be provided to the processing circuit 200.

Next, the processing step is performed.

First, the first operand a is read at S210.

To this end, the memory controller sets a type of the request as a read request and an address as the address A of the first operand, and provides the read request to the semiconductor device 1000.

Accordingly, the data output from the bank 11 is stored in the first operand register 211 as the first operand a.

Next, the second operand b is read at S220.

To this end, the memory controller sets a type of the request as a read request and an address as the address B of the second operand b, and provides the read request to the semiconductor device 1000.

Accordingly, the data output from the bank 11 is stored in the second operand register 212 as the second operand b.

The setting signal D provided from the fourth register 114 is provided to the processing circuit 200 to generate the processing result c.

At this time, the processing result c corresponds to a value obtained by adding the product of the operands a and b to an accumulated value ACC stored in the accumulation register 280 by a previous operation of the processing circuit 200.

Next, the processing result c is stored at S230.

To this end, the memory controller sets a type of request as a write request and an address as the address C to store the processing result c and provides the write request to the semiconductor device 1000. Accordingly, the operation result c is stored in the bank 11.

Finally, the termination step can be performed. When the termination step is performed, the fourth register 114 may be initialized at S310.

To this end, the memory controller sets a type of the request as a write request, an address as the fourth register address ADDR4, and a data DATA as "000 XXXX", where "X" indicates a "don't care" state, and provides the write request to the semiconductor device 1000.

Accordingly, the values stored in the first to third registers 111 to 113 are respectively marked as invalid, so that the first to third match signals MATCH1, MATCH2, and MATCH3 are inactivated and in-memory processing is not performed.

Although various embodiments have been illustrated and described, various changes and modifications may be made to the described embodiments without departing from the spirit and scope of the invention as defined by the following claims.

What is claimed is:

1. A semiconductor device comprising:
    a memory cell array;
    an address input circuit;
    a command decoder configured to decode a signal provided from a command input circuit;
    a data Input/Output (IO) circuit;
    a processing control circuit including a register array storing a first address of an operand;
    a processing circuit configured to provide a processing result by performing an operation on data provided from the memory cell array; and
    a switch circuit configured to control a data path among the processing circuit, the data IO circuit, and the memory cell array,
    wherein the processing control circuit determines whether a second address provided from the address input circuit corresponds to the first address stored in the register array, and
    wherein the switch circuit controls the data path to connect the memory cell array to the processing circuit when the second address provided from the address input circuit corresponds to the first address stored in the register array.

2. The semiconductor device of claim 1, wherein the processing control circuit further includes a register control circuit to store the first address in the register array.

3. The semiconductor device of claim 2, wherein the register control circuit stores data provided to the data IO circuit according to an output of the command decoder as the first address in the register array when the second address provided from the address input circuit corresponds to a predetermined register address associated with the register array.

4. The semiconductor device of claim 3, further comprising a mode register configured to store the predetermined register address.

5. The semiconductor device of claim 1, wherein the processing control circuit further includes a command identification circuit configured to identify a command for an in-memory processing by comparing the first address in the register array and the second address provided from the address input circuit.

6. The semiconductor device of claim 5, wherein the command identification circuit incudes:
    an address comparing circuit configured to compare the first address in the register array with the second address provided from the address input circuit; and
    a control signal generating circuit configured to output a match signal by combining an output from the address comparing circuit and an output from the command decoder.

7. The semiconductor device of claim 6, wherein the address comparing circuit includes:
    a row address comparator configured to compare the first address in the register array with a row address in the second address provided from the address input circuit; and
    a column address comparator configured to compare the first address in the register array with a column address in the second address provided from the address input circuit.

8. The semiconductor device of claim 7, wherein the command identification circuit further includes a table management circuit to manage a matching table to store a comparison result of the row address comparator.

9. The semiconductor device of claim 8, wherein the table management circuit manages data stored in the matching table with reference to a command from the command decoder, and
    wherein the comparison result of the row address comparator is stored in the matching table when a command from the command decoder is an active command, and the comparison result of the row address comparator is inactivated and stored in the matching table when a command from the command decoder is a precharge command.

10. The semiconductor device of claim 8, wherein the register array further stores a flag indicating whether the first address is valid, wherein the comparison result of the row address comparator is stored in the matching table when the flag is enabled, and the comparison result of the row address comparator is inactivated and stored in the matching table when the flag is disabled.

11. The semiconductor device of claim 8, wherein the memory cell array comprises a plurality of banks, and wherein the table management circuit stores the comparison result of the row address comparator in the matching table for each bank.

12. The semiconductor device of claim 11, wherein the command identification circuit further includes a bank selection circuit to provide a comparison result selected from the matching table corresponding to a bank address of the second address provided from the address input circuit.

13. The semiconductor device of claim 12, wherein the control signal generating circuit includes:

a first gate circuit configured to logically combine an output from the bank selection circuit and an indication that a read command or a write command has been provided from the command decoder; and a second gate circuit configured to logically combine an output of the first gate circuit and a comparison result of the column address comparator.

14. The semiconductor device of claim 1, wherein the register array further stores a setting signal to set the processing circuit, and the processing circuit changes a type of processing operation according to the setting signal.

15. The semiconductor device of claim 14, wherein the processing circuit performs one selected according to the setting signal of a multiplication and accumulation operation, an addition operation, a subtraction operation, and a multiplication operation.

* * * * *